(12) United States Patent
Lin

(10) Patent No.: US 7,786,761 B2
(45) Date of Patent: Aug. 31, 2010

(54) OUTPUT BUFFER DEVICE

(75) Inventor: Yung Feng Lin, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 23 days.

(21) Appl. No.: 12/024,404

(22) Filed: Feb. 1, 2008

(65) Prior Publication Data

US 2009/0195270 A1 Aug. 6, 2009

(51) Int. Cl.
*H03K 19/0175* (2006.01)
(52) U.S. Cl. ........................................... 326/82; 326/58
(58) Field of Classification Search ............. 326/82–88, 326/21–31
See application file for complete search history.

(56) References Cited

U.S. PATENT DOCUMENTS

| | | | | | |
|---|---|---|---|---|---|
| 4,638,187 | A | * | 1/1987 | Boler et al. | 326/27 |
| 4,961,010 | A | * | 10/1990 | Davis | 326/27 |
| 5,319,260 | A | * | 6/1994 | Wanlass | 326/26 |
| 6,111,446 | A | * | 8/2000 | Keeth | 327/258 |
| 6,686,763 | B1 | * | 2/2004 | Yen | 326/30 |
| 7,224,179 | B2 | * | 5/2007 | Kim | 326/26 |

* cited by examiner

*Primary Examiner*—Vibol Tan
*Assistant Examiner*—Crystal L Hammond
(74) *Attorney, Agent, or Firm*—Volpe and Koenig, PC

(57) ABSTRACT

A controlling output buffer slew rate method and an output buffer circuit for a memory device is provided. The output buffer include an output stage formed by a PMOS transistor and a NMOS transistor electrically connected in series, a pre-driver for respectively controlling each gate terminal of the PMOS transistor and the NMOS transistor in order to bring these transistors to the turning-on threshold, a first wire, for transmitting a pull-up signal, coupled between the output stage and the pre-driver, and a second wire, for transmitting a pull-down signal, coupled between the output stage and the pre-driver. After a DATA signal transition (logic state is changed from "H" to "L" or "L" from to "H"), the PMOS or NMOS transistor is turned off first, and then the NMOS or PMOS transistor is turned on due to the time difference between the pull-up signal and the pull-down signal.

13 Claims, 7 Drawing Sheets

OUTPUT BUFFER DEVICE

FIELD OF THE INVENTION

The present invention relates to a simple output buffer. More particularly, the present invention relates to an output buffer with controlled slew rate used in integrated circuit (IC) device.

BACKGROUND OF THE INVENTION

Output buffer or driver circuits are employed in integrated circuit devices (such as memory devices) as a means of transferring and amplify signals, provided to the input of another device, within a device. FIG. 1 shows a conventional output buffer 10, including a pull-up PMOS transistor 12 and a pull-down NMOS transistor 14. The PMOS transistor 12 has a source terminal S coupled to a supply voltage $V_{DD}$ and a drain terminal D coupled to both the output pad 16 and the drain terminal D of the NMOS transistor 14. The source terminal S of the NMOS transistor 14 is coupled to a ground potential GND. The output pad 16 is typically coupled to the inputs of one or more CMOS devices. These devices are modeled as a variable load capacitor 18 and the voltage across load capacitor 18 is denoted as $V_{OUT}$. In addition, there is a parasitic capacitance 19 at the output pad 16 associated with the PMOS transistor 12 and the NMOS transistor 14. The gate terminal G of the PMOS transistor 12 is coupled to the output terminal of a NAND gate 20. The gate terminal G of the NMOS transistor 14 is coupled to the output terminal of a NOR gate 22. A DATA signal DATA is applied to a first input terminal of the NAND gate 20 and to a first input terminal of the NOR gate 22. An active-low signal !ENABLE is applied to a second input terminal of the NOR gate 22 and to an input terminal of an INVERTER 24. The output of the INVERTER 24 is applied to a second input terminal of the NAND gate 20. The operations of the output buffer are list in Table 1.1 according to output buffer circuit in FIG. 1.

TABLE 1.1

| !ENABLE | DATA | PU | PD | PMOS | NMOS | load capacitor &parasitic Capacitance | Output pad |
|---|---|---|---|---|---|---|---|
| "L" state (0 V) | "H" state ($V_{DD}$) | "L" state | "L" state | turn on | turn off | Charge | $V_{DD}$ |
| "L" state | "L" state | "H" state | "H" state | turn off | turn on | Discharge | 0 V |

When the active-low signal !ENABLE is at "L" state, the output of the INVERTER 24 is at "H" state. With "H" state applied by the DATA signal DATA while the active-low signal !ENABLE is held at "L" state, the output signal PU from the NAND 20 and the output signal PD from the NOR 22 are both at "L" states. The PMOS transistor 12 is turned on (low source-drain resistance) and the NMOS transistor 14 is turned off (high source-drain resistance). The load capacitor 18 and the parasitic capacitance 19 will be charged through the source-drain resistance of the PMOS transistor 12. With "L" state applied by the DATA signal DATA while the active-low signal !ENABLE is held at "L" state, the output signal PU from the NAND 20 and the output signal PD from the NOR 22 are both at "H" states. The PMOS transistor 12 is turned off (high source-drain resistance) and the NMOS transistor 14 is turned on (low source-drain resistance). The load capacitor 18 and the parasitic capacitance 19 will discharge through the source-drain resistance of the NMOS transistor 14.

In particular, the need for fast processing of data and interface speed is becoming important, however, some noise issues exist for output buffer design such as simultaneous switching noise (SSN). The well-known issue, SSN, is a phenomenon associated with transistors switching where the gate voltage can appear to be less than the local ground potential, causing the unstable operation of a logic gate. As far as the output buffer technique design is considered, although it is hard to completely remove the SSN phenomenon, however, a proper output buffer design can lead to less SSN.

In view of above, the present approach for SSN is provided to reduce noise by short-circuit current reduction and slew rate control in output buffer design (specially in large output stage). Short-circuit current means that the last PMOS and NMOS transistors are simultaneously turned on during the short time. The so-called slew rate control first must know that "slew rate" means a variation rate of the voltage level of an output signal, so that it may be considered as a gradient of voltage to time. In a typical output buffer circuit, where the output stage including PMOS and NMOS transistors exhibits a high slew rate, large noise is generated, even there is an advantage in terms of data skew. On the other hand, a low slew rate causes an increase in the amount of data skew, even through there is a reduction in noise. Accordingly, it is necessary to appropriately adjust the slew rate of such the output pad to a desired value. Hence, the better slew rate control is to reduce the slope of current through final output stage in order to reduce the voltage ringing through package inductances. In FIG. 1, the prior art will suffer from both short-circuit current and larger di/dt effect if there are no remedies used.

Known issue about short-circuit current and slew rate control associated the tradeoff between speed and noise manipulation exits in present output buffer circuit design. What are needed are a better slew rate control method and a circuit to alleviate the simultaneous switching noise problem, in particular for output buffer applications.

SUMMARY OF THE INVENTION

An embodiment of the present invention provides an output buffer for a memory device that is free from the drawbacks described above.

An objective of the present invention is to provide an output buffer with minimizing short-circuit current existing between PMOS transistor and NMOS transistor when they are switched simultaneously.

Another objective of the present invention is to provide an output buffer with slew-rate control for reducing output signal ringing and achieving high circuit performance in high-speed interfaces.

Another objective of the present invention is to provide an output buffer capable of suppressing output signal change to a low speed while satisfying work characteristic of CMOS switch using one PMOS and one NMOS.

Another objective of the present is to provide an output buffer for a current producing device such as a CMOS device which includes improved slew-rate control and reduction of short-circuit current.

According to an embodiment of the present invention, the output buffer for a memory device is provided. The output buffer includes an output stage formed by a first transistor and a second transistor electrically connected in series between a supply potential and a ground potential; a pre-driver having a first output terminal, a second output terminal, a first node and a second node, the first output terminal being coupled to the second node and the first gate of the first transistor, the second output terminal being coupled to the first node and the second gate of the second transistor.

It is to be understood that both the foregoing general description and the following detailed description are by examples and are intended to provide further explanation of the invention as claimed.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

The rate of change of the drive strength of an output buffer can be designed to be constant, i.e., dependent on factors such as changes in process, temperature, voltage (PTV), and external load. The constant rate is achieved by varying the current supplied by the current sources to keep the time of charging/discharging constant. As a result, the switching noise is avoided/reduced even when the PTV conditions and/or the load greatly changes. These present special challenges for I/O designers. For the foregoing reasons, the present invention provides an output buffer with controlled slew rate and it's features and advantages of the present invention will be apparent from the accompanying drawings, and from the detailed description, that follows below.

First Embodiment

Figure 2:
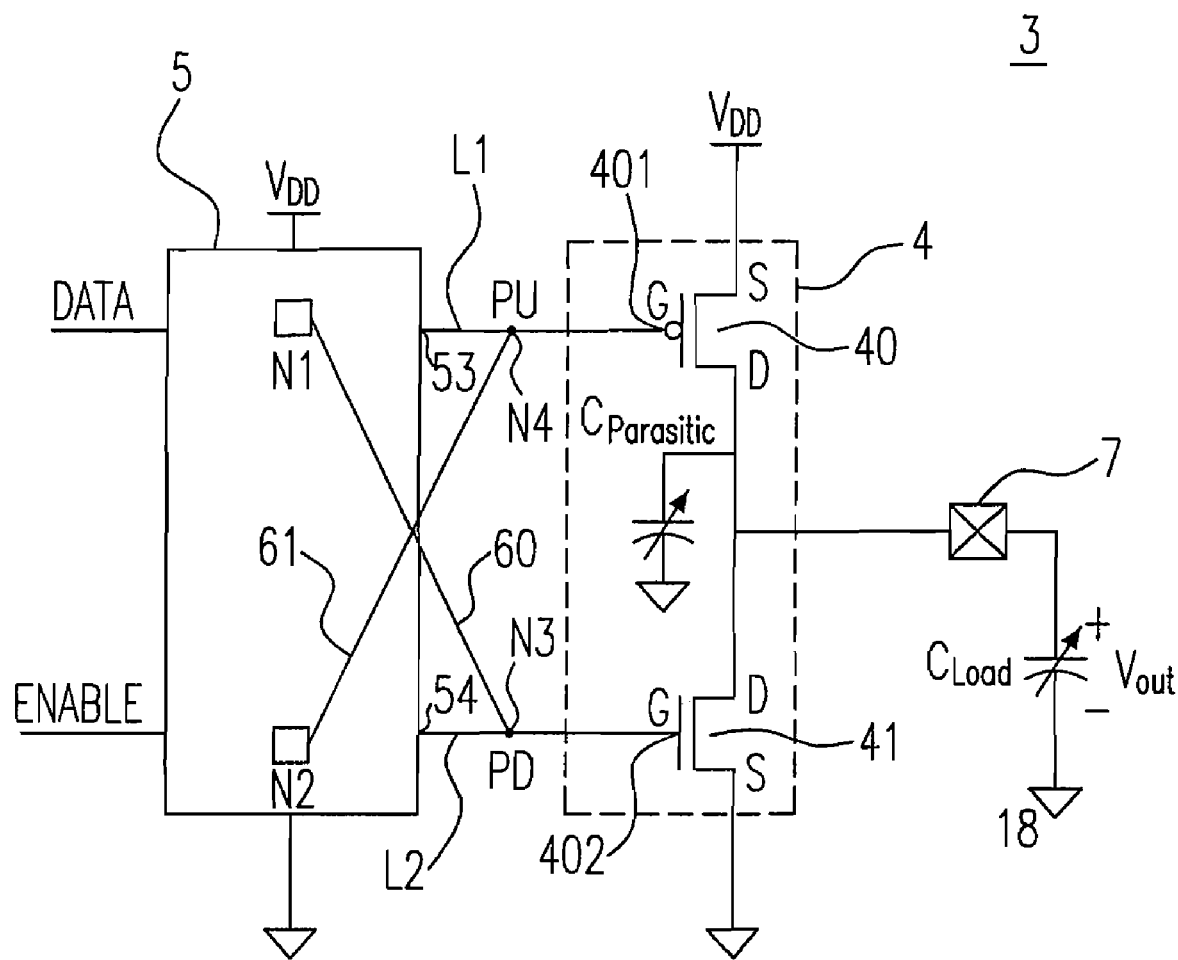
FIG. 2 illustrates a circuit implementation of an output buffer according to a first embodiment of the invention.

FIG. 2 shows a circuit of an output buffer according to a first embodiment of the invention, and the output buffer 3 includes an output stage 4 formed by a first switch 40 having a first control terminal 401 and a second switch 41 having a second control terminal 402, which are electrically connected in series between a supply line at a supply potential $V_{DD}$ and a ground line at a ground potential $V_{GND}$. In fact, as is known, the first switch 40 is a PMOS transistor and the second switch 41 is an NMOS transistor, and a pre-driver 5, having a first output terminal L1 and a second output terminal L2 coupled to each gate terminal 401, 402 of the PMOS transistor 40 and the NMOS transistor 41, for respectively controlling each gate terminal 401, 402 of the PMOS transistor 40 and the NMOS transistor 41 in order to bring these transistors 40, and 41 to the turning-on threshold.

Next, in the detailed description from the accompanying FIG. 2, the output buffer 3 comprises a first wire 60 and a second wire 61 and the first wire 60 is electrically coupled between a third node N3 at the second output terminal L2 and a first node N1 of the pre-driver 5, and the second wire 61 electrically coupled between a fourth node N4 at first output terminal L1 and a second node N2 of the pre-driver 5. In addition, an output pad 7 in the output buffer 3 is typically coupled to the input terminals of one or more CMOS devices. These devices are modeled as a variable load capacitor $C_{Load}$ and the voltage across load capacitor $C_{Load}$ is depicted as $V_{OUT}$. In addition, there is a parasitic capacitance $C_{parasitic}$ at the output terminal associated with the PMOS transistor 40 and the NMOS transistor 41.

As mentioned above, the PMOS transistor 40 has a source terminal S coupled to the supply potential $V_{DD}$, a gate terminal G coupled to a first output 53 of the pre-driver 5 through the first output terminal L1 and a drain terminal D coupled to both the output pad 7 (is also called as an output node)and a drain terminal D of NMOS transistor 41, whilst the NMOS transistor 41 has a source terminal S coupled to the ground potential $V_{GND}$, and a gate terminal G coupled to a second output 54 of the pre-driver 5 through the second output terminal L2.

Figure 3A:
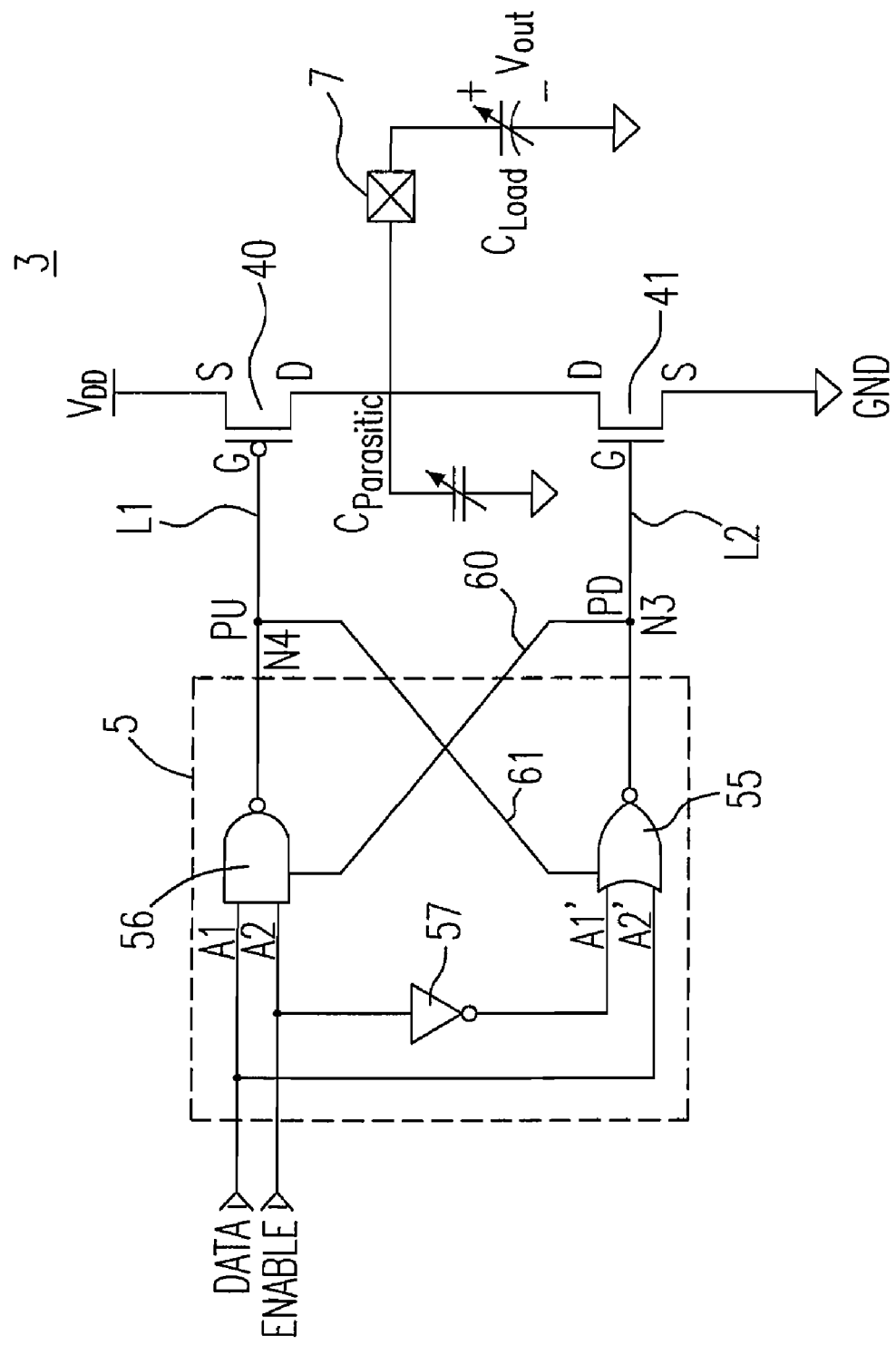
FIG. 3(a) illustrates a circuit of a pre-driver in the output buffer according to the first embodiment of the invention.

Specially, as illustrated in FIG. 3(a), the circuit implementation of the pre-driver 5 includes a NOR-like gate 55, a NAND-like gate 56 and an INVERTER 57 coupled to the NOR-like gate 55 and the NAND-like gate 56, respectively. Unlike the typical term "NOR gate" and "NAND gate" of the pre-driver, the so-called term NOR-like 55 and NAND-like gate 56 in present embodiment is to lie in their $V_{GND}/V_{DD}$ node being not always coupled to $V_{GND}/V_{DD}$. For instance, the original NOR gate's $V_{GND}$ node may be coupled to $V_{GND}$ or coupled to $V_{DD}$ and so does NAND gate's node. As the first embodiment is considered, NOR-like gate 55 and NAND-like gates' 56 $V_{GND}/V_{DD}$ node are correspondingly coupled to $V_{GND}/V_{DD}$. Notice that in this case the operation characteristics of the NOR-like gate 55 and NAND-like gate 56 are identical to that of typical NOR gate and NAND gate.

Figure 3B:
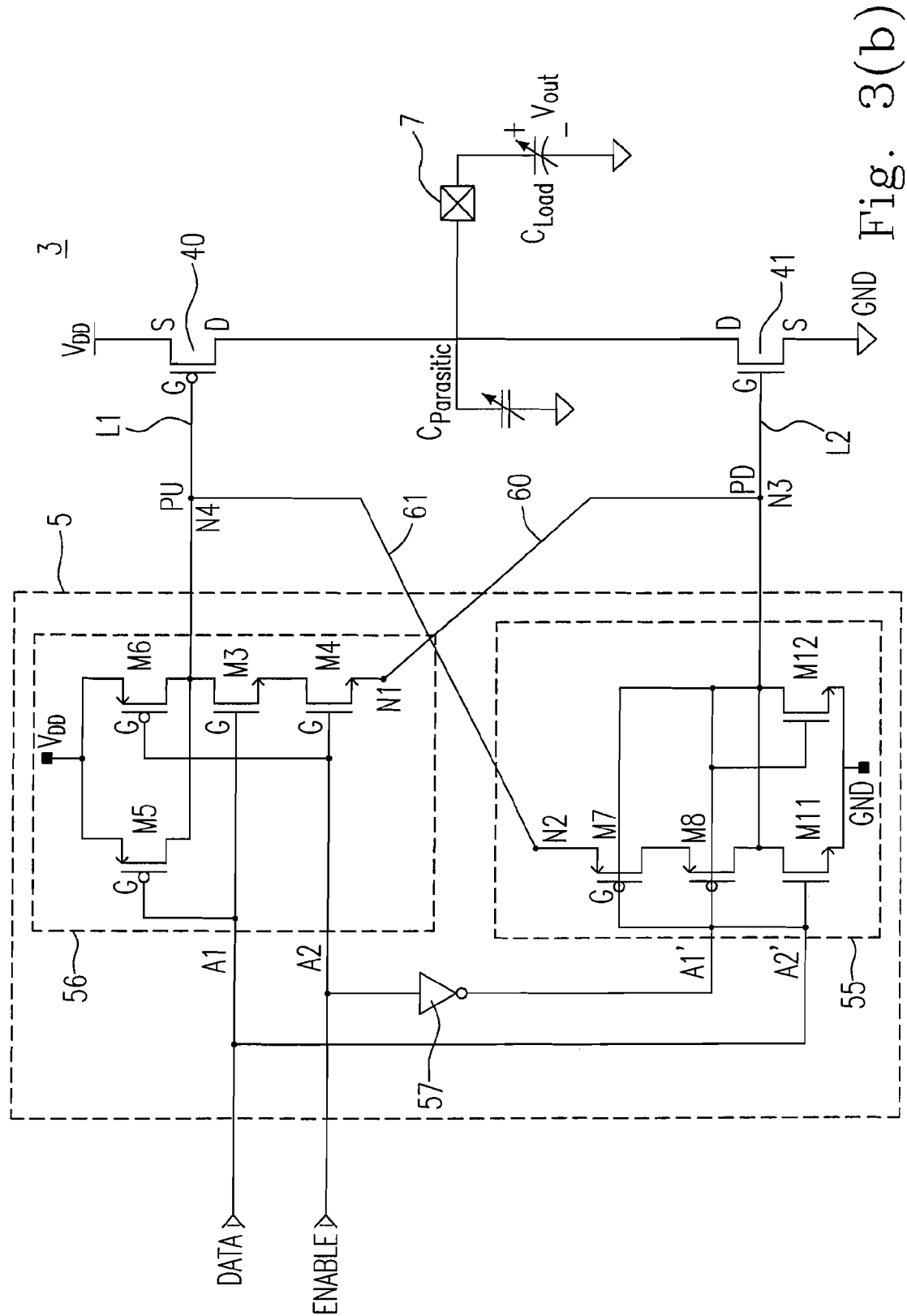
FIG. 3(b) illustrates implementations circuit of NAND-like gate and NOR-like gate of the pre-driver in the output buffer according to the first embodiment of the invention.

The detailed description for the NOR-like gate 55 and the NAND-like gate 56 of the pre-driver is shown in FIG. 3(b). The well-known implementation circuit of the NAND-like gate 56 has 2 NMOS transistors (M3 and M4) and 2 PMOS transistors (M5 and M6). Likewise, the well-known implementation circuit of the NOR-like gate 55 has 2 PMOS transistors (M7 and M8) and 2 NMOS transistors (M11 and M12). Through illustrated FIG. 3(b), clearly, the first node N1 of the pre-driver 5 is coupled to a ground potential $V_{GND}$ via the transistor M11 of the NOR-like gate 55 and the second node N2 of the pre-driver 5 is coupled to an another supply potential $V_{DD}$ via the transistor M5 of the NAND-like gate 56.

Referring to FIG. 3(a), the gate terminal G of the PMOS transistor 40 is coupled to the output of the NAND-like gate 56. The gate terminal G of the NMOS transistor 41 is coupled to the output of the NOR-like gate 55. A DATA signal DATA is applied to one input terminal A1 of the NAND-like gate 56 and to one input terminal A2' of the NOR-like gate 55. An enabling signal ENABLE is applied to a second input terminal A2 of the NAND-like gate 56 and to the input terminal of the INVERTER 57. The output of the INVERTER 57 is applied to a second input A1' of the NOR-like gate 55.

Figure 4:
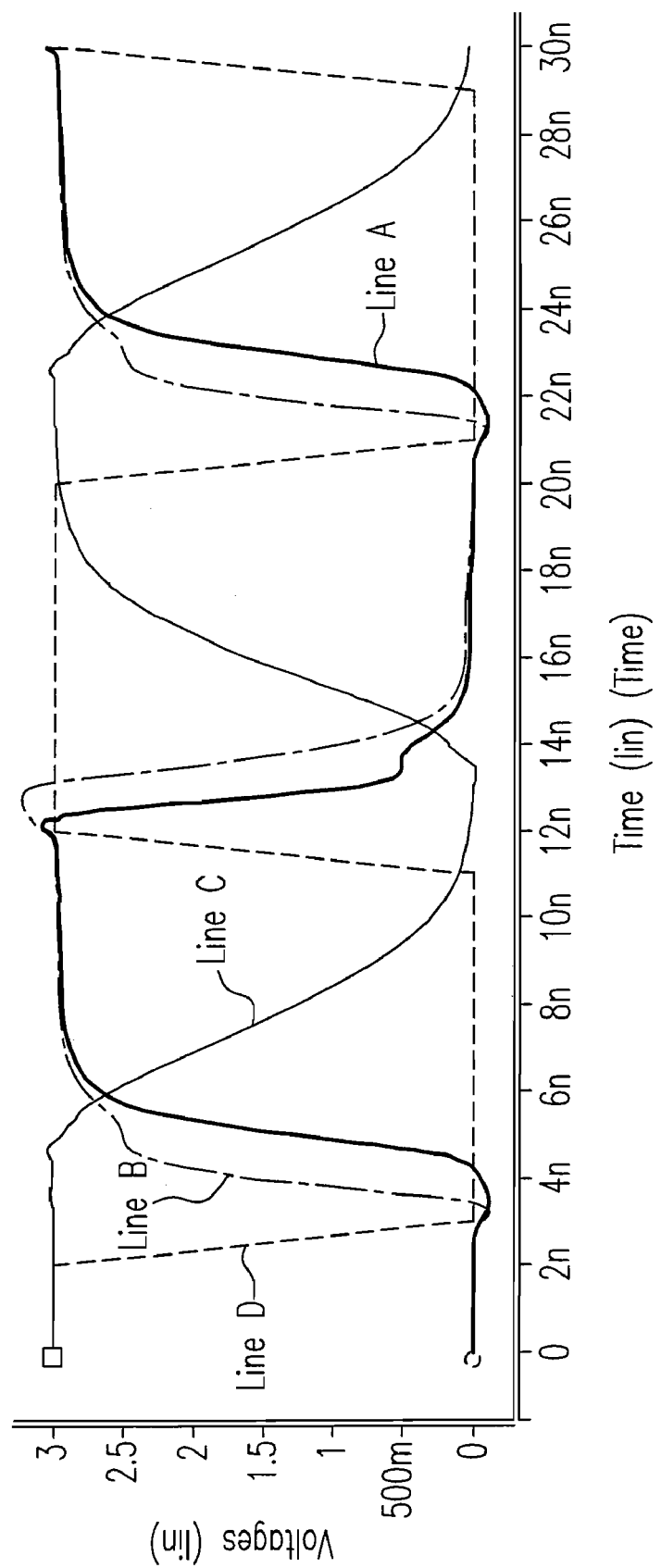
FIG. 4 illustrates the voltage waveform of a pull-down signal PD, a pull-up signal PU, a output pad signal OUT and a DATA signal DATA for the output buffer according to the first embodiment of the invention.

In the following detailed description of the present embodiment, referring to FIG. 3(b) and FIG. 4 at the same time, first of all, it is necessary to know that FIG. 4 illustrates the voltage waveform of a pull-down signal PD, a pull-up signal PU, an output signal OUT and a DATA signal DATA for the output buffer according to the first embodiment of the invention, wherein line A for the pull-down signal PD, line B for the pull-up signal PU, line C for the output signal OUT and line D for the DATA signal DATA.

At an initial state, (at time=0), when the enabling signal ENABLE is at $V_{DD}$ (logic "H"), the output buffer 3 is operated in the transmit mode. With "H" state ($V_{DD}$) applied by the DATA signal DATA while the enabling signal ENABLE is held at "H" state, a pull-up signal PU at a fourth node N4 on the first output terminal L1, which is generated from the output of the NAND-like gate 56 is at "L" state. "L" state on the gate terminal G of the PMOS transistor 40 will cause the path between the source S and the drain D thereof to be conducted. The PMOS transistor 40 becomes at an ON state. The load capacitor $C_{Load}$ and parasitic capacitance $C_{parasitic}$ will be charged through the source-drain resistance of the PMOS transistor 40.

On the other hand, with "H" state applied by the DATA signal DATA while the input ENABLE is held at "H" state and applied to the input terminal of the INVERTER 57, a pull-down signal PD at a third node N3 on the second output terminal L2, which is generated from the output terminal of the NOR-like gate 55, is at "L" state. "L" state on the gate terminal G of the NMOS transistor 41 will result in a high resistance between the drain D and the source S thereof. The NMOS transistor 41 becomes at an OFF state. Therefore, the logic level state of the output signal OUT is at "H" state ($V_{DD}$).

The period from time 2 ns to 11 ns is denoted as the first transmission stage from the DATA signal DATA to the output signal OUT. From time 2 ns to 3 ns, the DATA signal DATA is in transition (logic level state of the DATA signal DATA is changed from "H" level to "L" level), whilst the enabling signal ENABLE is at $V_{DD}$, a supply potential $V_{DD}$ is applied to the pre-driver 5 via the transistor M5. Then, the pull-up signal PU at the fourth node N4 starts to rise from the "L" (=$V_{GND}$) level toward "H" level (=$V_{DD}$). "H" state of the pull-up signal PU on the gate terminal G of PMOS transistor 40 will result in a high resistance between the source S and the drain D, and the PMOS transistor 40 becomes at an OFF state. After the starting time of the rising of the pull-up signal PU, the pull-down signal PD at the third node N3 just starts to rise from "L" (=$V_{GND}$) level toward "H" level (=$V_{DD}$) because PU is coupled to the second output terminal L2 of the pre-driver 5 through transistor M7 and M8. However, the rising of the pull-down signal PD generated from the NOR-like gate 55 lags behind the rising of the pull-up signal PU transmitted through the fourth node N4 at the second wire 61 by about 1 ns due to the reason that the second node N2 (at $V_{DD}$) is the power of the NOR-like gate 55.

Figure 1:
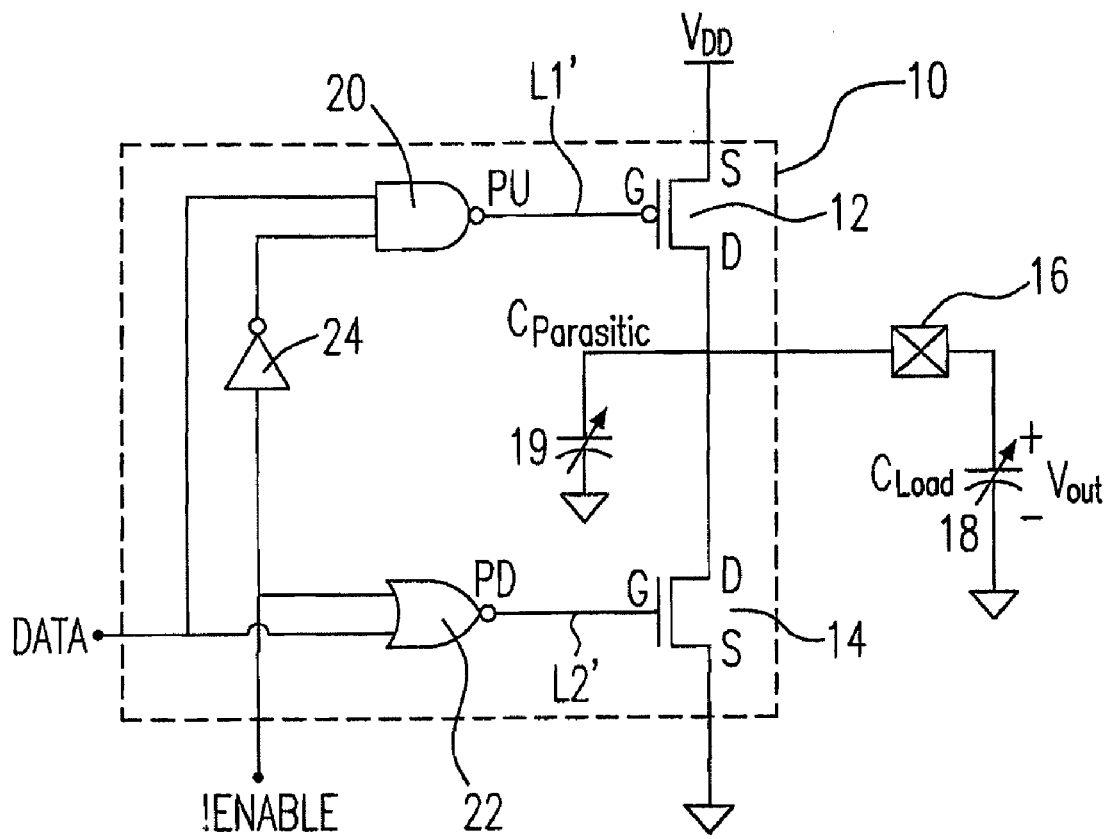
FIG. 1 schematically illustrating a prior art output buffer.

The slew rate control of output buffer design is the tuning operation for the slope of PU/PD which drives PMOS/NMOS output stage. Steeper slope means larger di/dt and should be well controlled in order not to cause larger ring at output terminal due to package inductance. For example, compared with prior art in FIG. 1 and FIG. 3(a), the rising-up slope of the pull-down signal PD in FIG. 3(a) is slower than that in FIG. 1 because it must transverse through sum of capacitance (including wire, junction and gate)loading on the first output terminal L1 and the second output terminal L2. However, the pull-down signal PD of prior art is ramped-up faster because it only transverse through capacitance (including wire, junction and gate) loading the second output terminal L2'. Therefore, the first embodiment achieves better slew rate control.

At time 11 ns, there is a first final state for the DATA signal DATA at "L" state (=$V_{GND}$), and the enabling signal ENABLE is at $V_{DD}$ (logic "H"). The DATA signal DATA is applied to one input terminal A1 of the NAND-like gate 56 and to one input A2' of the NOR-like gate 55. The enabling signal ENABLE is applied to a second input A2 of the NAND-like gate 56 and to the input of the INVERTER 57. The output of the INVERTER 57 is applied to a second input terminal A1' of the NOR-like gate 56.

With "L" state (at $V_{GND}$) applied by the DATA signal DATA while the enabling signal ENABLE is held at "H" state, the logic level of the pull-up signal PU generated from the output terminal of the NAND-like gate 55 is at "H" level on the gate terminal G of the PMOS transistor 40 that will result in a high resistance between the source S and the drain D, and the PMOS transistor 40 becomes at an OFF state.

On the other hand, with "L" state applied by the DATA signal DATA while the enabling signal ENABLE is held at "H" state and applied to the input terminal of the INVERTER 57, the pull-down signal PD generated from the output of the NOR-like gate 56 is at "H" state on the gate terminal G of the NMOS transistor 41 and the NMOS transistor 41 is turned on (low source-drain resistance). The load capacitor $C_{Load}$ and parasitic capacitance $C_{parasitic}$ will discharge through the source-drain resistance of the NMOS transistor 41. It is noted that the logic level state of the output signal OUT is at "L" state (=$V_{GND}$).

The period from time 11 ns to 20 ns is denoted as the second transmission stage from the DATA signal DATA to the output signal OUT. From time 11 ns to 12 ns, the DATA signal DATA is changed from "L" level (=$V_{GND}$) to "H" level ($V_{DD}$). Then the voltage of the pull-down signal PD at the third node N3 on the second output terminal L2 will fall to $V_{GND}$ first through the transistor M11, because the third node N3 on the second output terminal L2 is the $V_{GND}$ power node (is at $V_{GND}$) of the NAND-like gate 56 through transistor M11. After the starting time of the falling of the pull-down signal PD, the pull-up signal PU at the fourth node N4 starts to fall from "H" (=$V_{DD}$) level toward "L" level (=$V_{GND}$). Obviously, the falling of the pull-up signal PU lags behind the pull-down signal PD by about 1 ns. The timing difference 1 ns is enough to make sure that the logic level of the pull-down signal PD is changed from "H" to "L" resulting in the NMOS transistor 41 to be turned off (high source-drain resistance) before the logic level of the pull-up is changed from "H" to "L" resulting in the PMOS transistor 40 to be turned on (low source-drain resistance. Compared with prior art in FIG. 1 and FIG. 3(a), the falling-down slope of the pull-up signal PU in FIG. 3(a) is slower than that in FIG. 1 because it must transverse through sum of capacitance(including wire, junction and gate) loading on the first output terminal L1 and the second output terminal L2. However, the pull-up signal PU of prior art is ramped-down faster because it only transverse through capacitance (including wire, junction and gate) loading the first output terminal L1'. Therefore, the first embodiment achieves better slew rate control.

At time 20 ns, there is a second final state for the DATA signal DATA (=$V_{DD}$), and the DATA signal (at $V_{DD}$) is applied to one input A1 of the NAND-like gate 56 and to one input A2' of the NOR-like gate 57. The enabling signal ENABLE is applied to a second input A2 of the NAND-like gate 56 and to the input of the INVERTER 57. The output of the INVERTER 57 is applied to a second input terminal A1' of the NOR-like gate 55.

When the enabling signal ENABLE is at $V_{DD}$ (logic "H"), the output buffer 3 is operated in the transmit mode. With "H" state (at $V_{DD}$) applied by the DATA signal DATA while the enabling signal ENABLE is held at "H" state, the pull-up signal PU generated from the output of the NAND-like gate 56 is "L" state. "L" state on the gate terminal G of the PMOS transistor 40 will cause the path between the source S and the drain D thereof to be conducted. The PMOS transistor 40 becomes at an ON state. The load capacitor $C_{Load}$ and the parasitic capacitance $C_{parasitic}$ will be charged through the source-drain resistance of the PMOS transistor 40.

On the other hand, with "H" state applied by the DATA signal DATA while the enabling signal ENABLE is held at "H" state and applied to the input terminal of the INVERTER 57, a pull-down signal PD generated from the NOR-like gate 55 is "L" state. "L" state on the gate terminal G of the NMOS transistor 41 will result in a high resistance between the drain D and the source S thereof. The NMOS transistor 41 becomes at an OFF state. It is noted that the logic level state of the output signal OUT is at $V_{DD}$.

Analysis of Current Waveform

Figure 5:
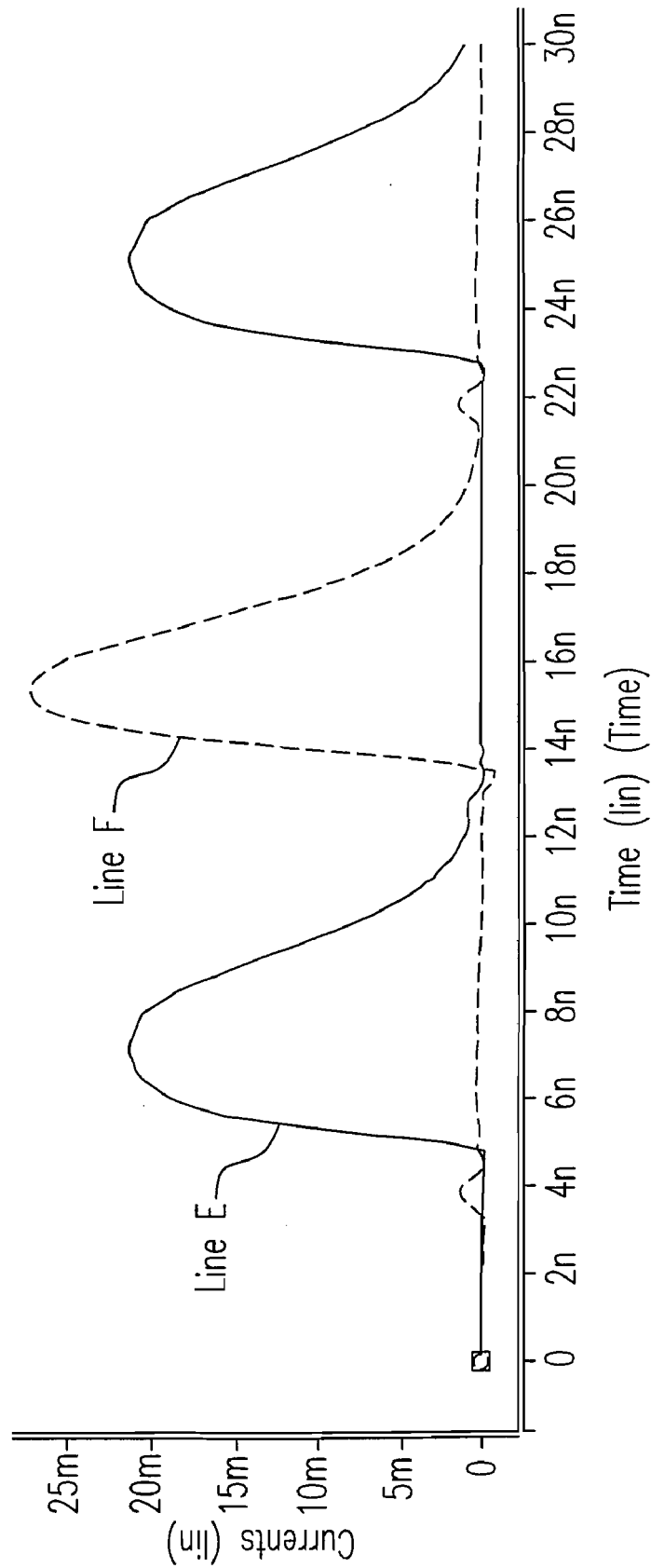
FIG. 5 shows currents of an NMOS transistor and a PMOS transistor in the output buffer in FIG. 2 with improved slew-rate control.

Referring to FIG. 5, which illustrates current waveform for the NMOS transistor (line E for NMOS transistor) and the PMOS transistor (line F for PMOS transistor) well controlled than prior art. After the first transmission stage from the DATA signal DATA to the output signal OUT (time from 2 ns to 11 ns), the PMOS transistor will be turned off first and then the NMOS transistor is turned on. Apparently, there is no overlapped current at the same time in FIG. 5.

Correspondingly, after the second transmission stage from the DATA signal DATA to the output signal OUT (time 11 ns to 20 ns), the NMOS transistor is turned off before the PMOS transistor is turned on. Similarly, there is no overlapped current at the same time in FIG. 5.

In brief, the foregoing description of the first embodiments of the invention has some advantages that after the DATA signal transition (logic state is changed from "H" to "L" or from "L" to "H", that is, logic state from relatively high level to relatively low level or relatively low level to relatively high level), the PMOS/NMOS transistor is turned off first, and then the NMOS/PMOS transistor is turned on due to the time difference between the pull-up signal and the pull-down signal. Besides, it is still required to explain that the first output terminal provides an output voltage based on which logic level state of the pull-up signal is determined and the second output terminal provides an output voltage based on which logic level state of the pull-down signal is determined after DATA transition.

As mentioned above, utilizing the present output buffer circuit with improved slew-rate control is to reduce short-circuit current. The operations of the output buffer are list in Table 1.2 according to output buffer circuit in FIG. 3(a).

TABLE 1.2

| ENABLE | DATA | PU | PD | PMOS | NMOS | load capacitor &parasitic Capacitance | Output pad |
|---|---|---|---|---|---|---|---|
| "H" state ($V_{DD}$) | "H" state ($V_{DD}$) | "L" state | "L" state | on state | off state | Charge | $V_{DD}$ |
| "H" state ($V_{DD}$) | "H" state to "L" state (0 V) | "H" state | "H" state | Turn off first | Then turn on | Discharge | $V_{DD}$ to 0 V |
| "H" state ($V_{DD}$) | "L" state | "H" state | "H" state | off state | on state | Discharge | 0 V |
| "H" state ($V_{DD}$) | "L" state to "H" state | "H" state | "H" state | Then turn on | Turn off first | charge | 0 V to $V_{DD}$ |
| "H" state ($V_{DD}$) | "H" state | "L" state | "L" state | on state | off state | charge | $V_{DD}$ |

At the same time, with respect to improved slew-rate control in the present output buffer circuit design, referring to FIG. 4, for the enabling signal ENABLE and DATA signal DATA and are both logic high state, the output signal OUT is also logic high state. When DATA signal DATA is switched from logic high to logic low, as explained previously, the pull-down signal PD will ramped up to $V_{DD}$ slower than prior art because the pull-up signal PU must ramp up first. However, the ramp-up speed of the pull-down signal PD in prior art is faster because it is no slew rate relationship with the pull-up signal PU. For the DATA signal DATA is logic low and enabling signal ENABLE is logic high state, the output signal OUT is logic low state. When the DATA signal DATA is switched from logic low to logic high, as explained previously, the pull-up signal PU will ramped down to $V_{GND}$ slower than prior art because the pull-down signal PD must ramp down first. However, the ramp-down speed of the pull-up signal PU in prior art is faster because it is no slew rate relationship with the pull-down signal PD.

Consequently, the output buffer circuit of the present invent assures that the PMOS transistor and the NMOS transistor in the pre-driver will not be simultaneously turn on after the transition period of the DATA signal DATA to avoid generating short-circuit current between the gate and the channel of each of the transistors.

Known prior art arrangements for achieving slew-rate control and reduction of short-circuit have been relatively complicated in terms of the number of complicated components that are required, and have been less than completely effective in providing the requisite level of control. The present invention is directed towards overcoming the disadvantages of the prior art mentioned above, in particularly, to reduce short-circuit.

Second Embodiment

The second embodiment shows that NAND/NOR gate in the pre-driver are buffered with inverter chain. Therefore, in FIG. 6, the pre-driver 5 further provides a first inverter 71, a second inverter-like gate 72, a third inverter 73 and a fourth inverter-like gate 74 to support a high driving capacity to an NAND gate 75 and an NOR gate 76 with large loading. Here, the pre-driver 5 comprises NAND gate and the NOR gates' $V_{GND}/V_{DD}$ node coupled to $V_{GND}/V_{DD}$, however, the term second inverter-like gate 72 and fourth inverter-like gate 74 differ from typical inverters owing to their $V_{GND}/V_{DD}$ node being not always coupled to $V_{GND}/V_{DD}$. Still, it is required to explain that the operation characteristics of second inverter-like gate 72 and fourth inverter-like gate 74 are identical to that of typical inverters.

Figure 6:
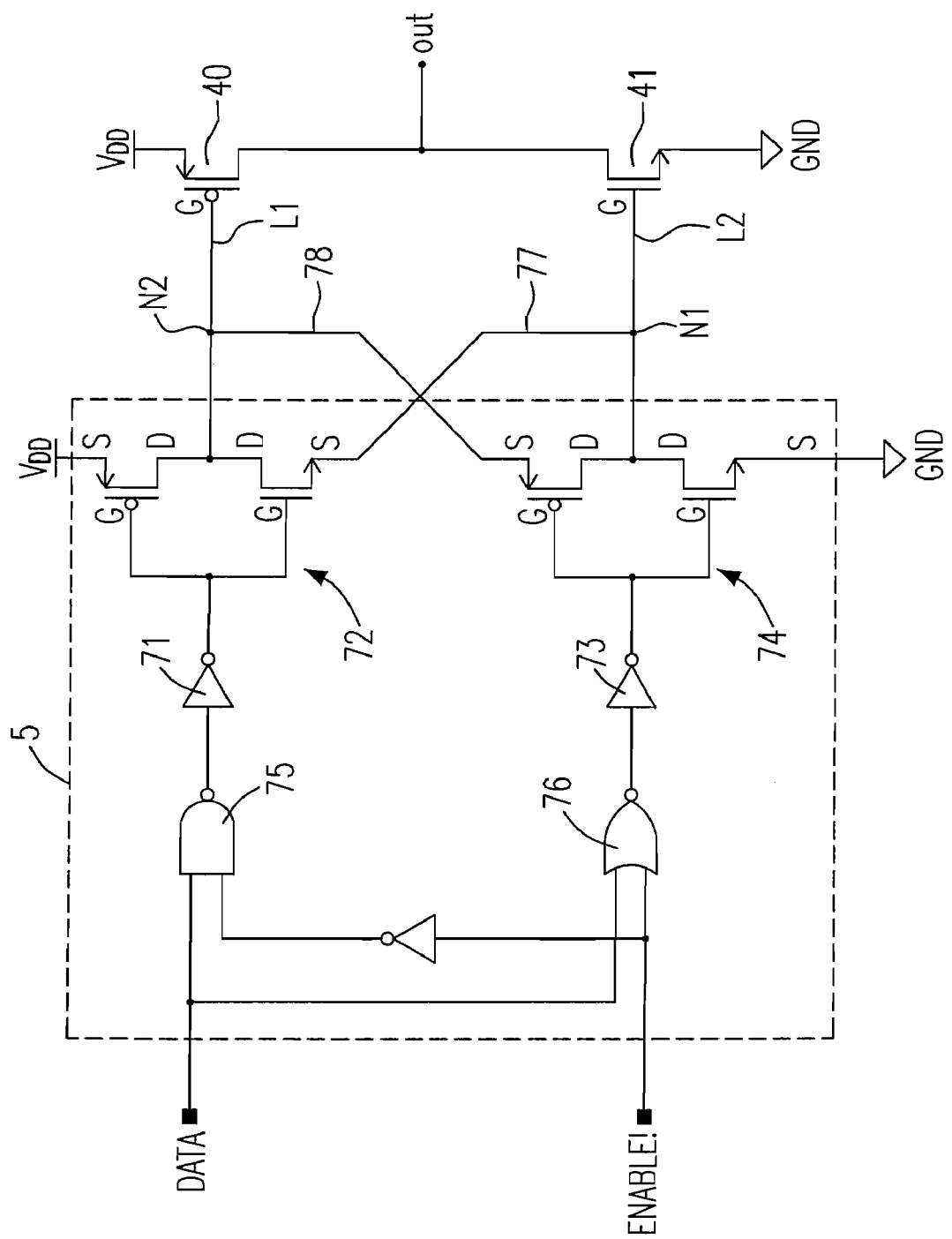
FIG. 6 illustrates another circuit of an output buffer according to the first embodiment of the invention in FIG. 3.

Referring to FIG. 6, the first inverter 71 inverts the output of the NAND gate 75, and the second inverter-like gate 72 includes a P-channel FET and a N-channel FET. The P-channel FET and the N-channel FET (and all other FETs in output buffer) are enhancement mode FETs. The source of the P-channel FET is coupled to a supply potential $V_{DD}$ and the gates of P-channel FET and N-channel FET are coupled to the output terminal of the first inverter 71 and the drains of the P-channel FET and the N-channel FET are coupled together to form an output terminal, coupled to the gate of the PMOS transistor 40, of second inverter-like gate 72. The source (is a ground terminal of the second inverter-like gate 72) of N-channel FET is coupled to the first node N1 on the second L2 through the first wire 77. That is, the source of N-channel FET of the second inverter-like gate 72 is coupled to an output terminal of the fourth inverter-like gate 74. The second inverter-like gate 72 inverts the signal from the output of the first inverter 71, and also acts as a buffer between NAND gate 75 and the large output driver FETs of pull-up circuit.

Similarly, the third inverter 73 inverts the output of the NOR gate 76, and the fourth inverter-like gate 74 includes a P-channel FET and a N-channel FET. The source (is a power supply terminal of the fourth inverter-like gate 74) of the P-channel FET is coupled to the second node N2 on the first L1 through the second wire 78(that is, the source of P-channel FET of the fourth inverter-like gate 74 is coupled to an output terminal of the second inverter-like gate 72) and the gates of P-channel FET and N-channel FET are coupled to the output of the third inverter 73 and the drains of P-channel FET and N-channel FET are coupled together to form an output terminal, coupled to the gate of the NMOS transistor 41, of fourth inverter-like gate 74 and the source of the N-channel FET is coupled to a ground potential $V_{GND}$. The fourth inverter-like gate 74 buffers the NOR gate 76 from the large output driver FETs of pull-down circuit.

As previously explained in FIG. 3(a), the configuration in FIG. 6 can also help to short-circuit current reduction and slew rate control compared with the prior art without cross connection between the second wire 78/first wire 77 and the second inverter-like gate 72/the fourth inverter-like gate 74 structure.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An output buffer, comprising:
   an output stage including a first transistor having a first gate and a second transistor having a second gate, both of the first and the second transistors being electrically connected in series between a power supply and a ground;
   a pre-driver including a first logic gate outputting a first output signal to the first transistor terminal, and a second logic gate outputting a second output signal to the second transistor, wherein the first output signal is fed back to the second logic gate to serve as a power supply node thereof, and the second output signal is fed back to the first logic gate to serve as a ground node thereof, the first logic gate receives a pull-down signal, and the second logic gate receives a pull-up signal.

2. An output buffer according to claim 1, wherein the first transistor is a PMOS transistor, and the second transistor is an NMOS transistor.

3. An output buffer according to claim 1, wherein the pre-driver comprises an NOR-like gate, an NAND-like gate and an INVERTER coupled to the NOR-like gate and the NAND-like gate.

4. An output buffer according to claim 3, wherein the first logic gate is coupled to another ground via at least one of a plurality of the transistors of the NOR-like gate; and
   the second logic gate is coupled to another supply voltage via at least one of a plurality of the transistors of the NAND-like gate.

5. An output buffer according to claim 3, wherein the pre-driver generates a pull-up signal based on an output signal from the NAND-like gate.

6. An output buffer according to claim 5, wherein the first logic gate provides an output voltage based on which a logic level state of the pull-up signal is determined.

7. An output buffer according to claim 3, wherein the pre-driver generates a pull-down signal based on an output signal from the NOR-like gate.

8. An output buffer according to claim 7, wherein the second logic gate provides an output voltage based on which a logic level state of the pull-down signal is determined.

9. An output buffer according to claim 1, wherein the pre-driver further comprises:
   a first inverter inverts the output of an NAND gate;
   a second inverter-like gate having a input terminal coupled to an output of the first inverter and an output terminal coupled to the gate of the first transistor;
   a third inverter inverts the output of an NOR gate; and
   a fourth inverter-like gate having a input terminal coupled to an output of the third inverter, an output terminal coupled to the gate of the second transistor and a ground terminal of the second inverter-like gate, and a power supply terminal coupled to the output terminal of the second inverter-like gate.

10. An operation method of an output buffer including a first switch, a second switch, an output node between the first switch and the second switch, and a pre-driver that is provided with a first logic gate, and a second logic gate comprising the steps of:
    generating a pull-up signal and a pull-down signal by means of the pre-driver upon receiving a DATA signal; and
    transmitting the pull-up signal from the first logic gate to the first switch and the pull-down signal from the second logic gate to the second switch, and simultaneously feeding back the pull-up signal to the second logic gate to serve as a power supply node thereof and the pull-down signal to the first logic gate to serve as a ground node thereof.

11. A method according to claim 10, wherein after the DATA signal transition, the first switch is turned on/off according to the logic level state of the pull-up signal, and the second switch is turned on/off according to the logic level state of the pull-down signal.

12. A method according to claim 11, wherein the first switch/the second switch is turned off first and then the second switch/the first switch is turned on due to the time difference between the pull-up signal and the pull-down signal.

13. A method according to claim 10, wherein the pull-up signal is fed back to the second logic gate to serve as a power supply node thereof, and the pull-down signal is fed back to the first logic gate to serve as a power supply node thereof.

* * * * *

UNITED STATES PATENT AND TRADEMARK OFFICE
CERTIFICATE OF CORRECTION

| | |
|---|---|
| PATENT NO. | : 7,786,761 B2 |
| APPLICATION NO. | : 12/024404 |
| DATED | : August 31, 2010 |
| INVENTOR(S) | : Yung Feng Lin |

Page 1 of 1

It is certified that error appears in the above-identified patent and that said Letters Patent is hereby corrected as shown below:

In Column 10, Line 8, in Claim 1, after "output signal to the first transistor", delete "terminal".

Signed and Sealed this
Twenty-sixth Day of April, 2011

David J. Kappos
*Director of the United States Patent and Trademark Office*